(12) United States Patent
Tudury et al.

(10) Patent No.: US 8,483,534 B2
(45) Date of Patent: Jul. 9, 2013

(54) MODIFIED REFRACTIVE INDEX PROFILE FOR LOW-DISPERSION MULTI-MODE FIBER

(75) Inventors: Gaston E. Tudury, Lockport, IL (US); Richard J. Pimpinella, Frankfort, IL (US)

(73) Assignee: Panduit Corp., Tinley Park, IL (US)

( * ) Notice: Subject to any disclaimer, the term of this patent is extended or adjusted under 35 U.S.C. 154(b) by 310 days.

(21) Appl. No.: 12/859,629

(22) Filed: Aug. 19, 2010

(65) Prior Publication Data

US 2011/0044594 A1 Feb. 24, 2011

Related U.S. Application Data

(60) Provisional application No. 61/235,236, filed on Aug. 19, 2009.

(51) Int. Cl.
*G02B 6/02* (2006.01)
(52) U.S. Cl.
USPC ............ 385/124; 385/123; 385/141; 385/142
(58) Field of Classification Search
USPC ......................................................... 385/124
See application file for complete search history.

(56) References Cited

U.S. PATENT DOCUMENTS

| | | | |
|---|---|---|---|
| 4,057,320 | A | 11/1977 | Marcatili |
| 5,911,025 | A | 6/1999 | Garito et al. |
| 6,438,303 | B1 | 8/2002 | Abbott, III et al. |
| 6,790,529 | B2 | 9/2004 | Pleunis et al. |
| 2005/0008312 | A1 | 1/2005 | Jang et al. |
| 2006/0034573 | A1 | 2/2006 | Guan et al. |
| 2007/0172182 | A1 | 7/2007 | Lee et al. |

FOREIGN PATENT DOCUMENTS

EP 2144096 A1 1/2010

OTHER PUBLICATIONS

Pimpinella et al, "Differential Mode Delay (DMD) for Multimode Fiber Types and Its Relationship to Measured Performance", National Fiber Optic Engineers Conference, Mar. 6, 2005.*
Important Consideration for Assuring 10Gb/s Ethernet Channel Link Performance; LANline Magazine; 7 pages; Dec. 2007.

* cited by examiner

*Primary Examiner* — Ryan Lepisto
(74) *Attorney, Agent, or Firm* — Robert A. McCann; Christopher S. Clancy; Yuri Astvatsaturov (57) ABSTRACT

An improved multimode fiber optic cable is provided. The improved multimode fiber optic cable includes, but is not limited to, a refractive index profile which is designed to compensate for a radially dependent wavelength distribution of laser launch modes coupled into the multimode fiber optic cable in order to minimize modal dispersion within the multimode fiber optic cable.

2 Claims, 15 Drawing Sheets

MODIFIED REFRACTIVE INDEX PROFILE FOR LOW-DISPERSION MULTI-MODE FIBER

CROSS-REFERENCES TO RELATED APPLICATIONS

The present application claims the benefit of U.S. Provisional Patent Application No. 61/235,236, entitled "MODIFIED REFRACTIVE INDEX PROFILE FOR LOW-DISPERSION MULTI-MODE FIBER," filed Aug. 19, 2009, the content of which is hereby incorporated herein in its entirety.

The present application incorporates in their entireties U.S. patent application Ser. No. 12/797,328, entitled "DESIGN METHOD AND METRIC FOR SELECTING AND DESIGNING MULTIMODE FIBER FOR IMPROVED PERFORMANCE," filed Jun. 9, 2010; and U.S. patent application Ser. No. 12/627,752, entitled "MULTIMODE FIBER HAVING IMPROVED INDEX PROFILE," filed Nov. 30, 2009.

BACKGROUND

State-of-the-art high-speed optical transceivers designed for multimode fiber optic cable (MMF) transmission use Vertical Cavity Surface Emitting Lasers (VCSELs) as light sources. VCSELs, like conventional Light Emitting Diodes (LEDs) are surface emitting devices; but unlike LEDs the physical structure of a VCSEL comprises a layer of multiple quantum wells between Bragg Reflectors forming a laser cavity. As a result, the output of the VCSEL is highly coherent, comprising discrete optical modes. The device supports a single longitudinal mode coupled with multiple transverse modes resulting in a distribution of light with slightly different wavelengths. In addition, each mode has a defined emission pattern. This physical effect results in an emission pattern in which the emitted wavelength is radius-dependent. The VCSEL modes are also dynamic, and in combination with the optical properties of MMF cause variability in MMF system performance. Performance variations can be attributed to MMF core defects and modal dispersion effects.

Figure 1:
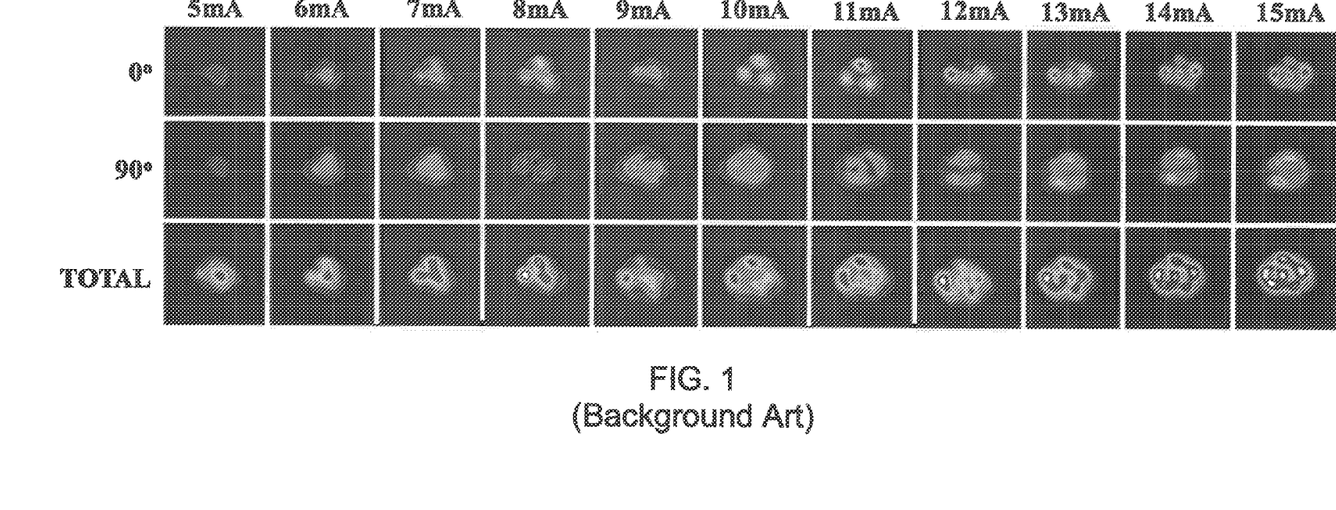
FIG. 1 depicts images of various modes excited in a representative VCSEL for increasing drive current, in accordance with one embodiment of the present invention. Each transverse mode has two possible polarization states, labeled 0° and 90°. These two polarization states add to form the total modal output distribution.

Most MMFs contain one or more core defects resulting from variations in gas flow control during the fabrication process. It is possible to modify the refractive index profile such that process variations produce a refractive index profile or bias that compensates for the effect of wavelength dependent VCSEL emission patterns that will improve fiber performance. To determine the optimum index profile with no core defects, one must first consider the optical modes emitted by a VCSEL. With reference to FIG. 1, exited optical modes are shown as a function of drive current for a representative VCSEL.

Figure 2:
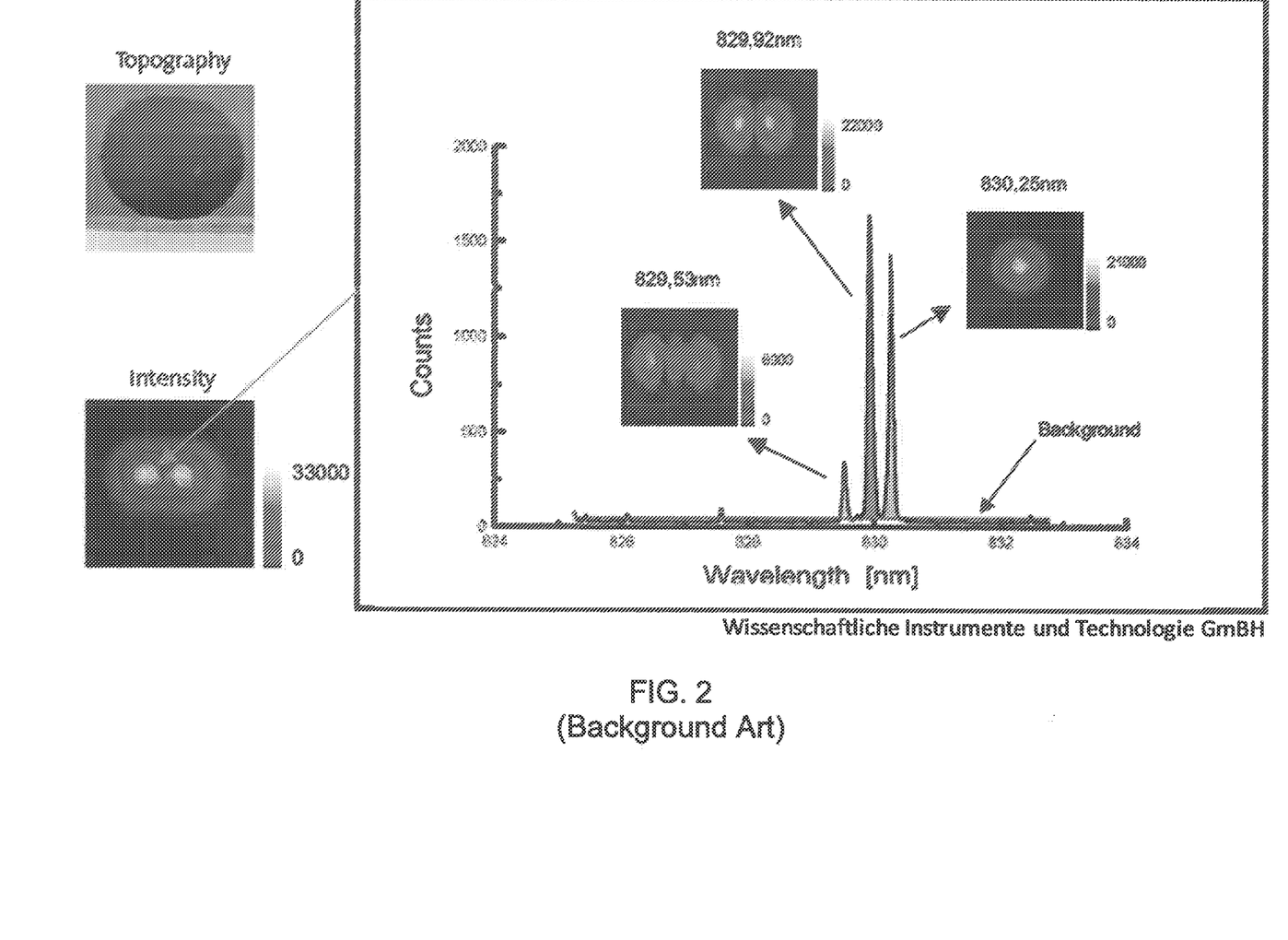
FIG. 2 depicts a graph of published data showing the correlation between VCSEL mode and optical wavelength ("Scanning Near-field Optical Microscopy VCSEL's", Copyright WITec Wissenschaftliche Instrumente and Technologie GmBH 2000), in accordance with one embodiment of the present invention. Higher-order modes have shorter wavelength. Higher order modes occupy larger radial regions of the device.

Due to the crystal structure and circular symmetry of the device, there are two polarization states for each excited transverse mode in a VCSEL. The electric field orientation defines the polarization state of the optical mode. When the drive current is turned on (5 mA), the fundamental mode is excited near the center of the device. As the drive current is increased, more modes (higher-order modes) are excited, which occupy the outer regions of the active area or aperture of the device. Each mode has a discrete optical energy and is therefore characterized by a discrete optical wavelength given by, $E=hc/\lambda$, where $h$=Planck's constant and $c$ is the speed of light. Lower-order modes have longer wavelengths whereas higher order modes have shorter wavelengths and higher energy. This correlation between mode and wavelength is illustrated in FIG. 2. The fundamental mode is shown to have the longest wavelength and higher-order modes have shorter wavelengths.

Due to the radially dependent wavelengths of the VCSEL modes, the modes that propagate in the fiber also have a wavelength dependence. Lower-order VCSEL modes couple into lower-order fiber modes, whereas higher-order VCSEL modes couple into higher-order fiber modes. This wavelength dependence is demonstrated in the optical spectral analysis shown in FIG. 3. In this analysis, a MMF is connected to a high-speed optical transmitter containing a VCSEL. A single-mode fiber (SMF) having a core diameter of 5 microns (SMF for 850 nm) is scanned across the output end of the MMF. Using an Optical Spectrum Analyzer (OSA), the optical spectrum of the modes is recorded as a function of radial displacement. There are typically five or more primary wavelengths emitted by a VCSEL. In the region of each primary wavelength there are typically several closely spaced wavelengths generated by other modes or polarization states.

Figure 3:
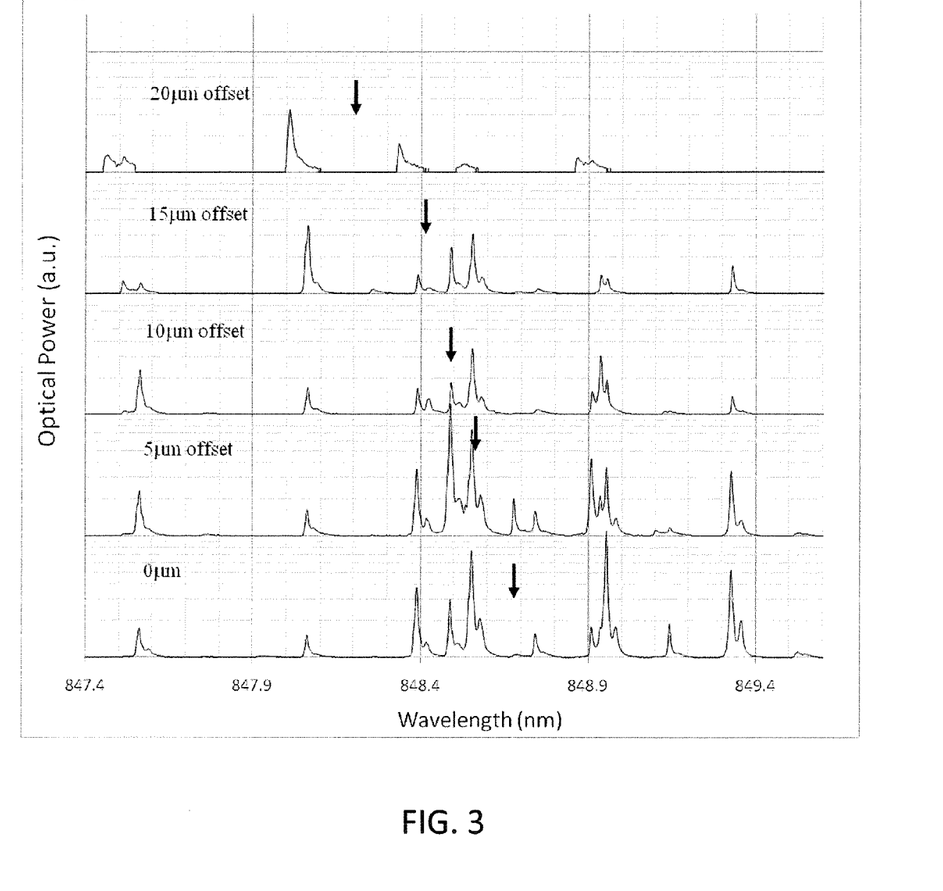
FIG. 3 depicts a graph of an optical spectrum as a function of radial offset in 5 micron steps in a MMF, in accordance with one embodiment of the present invention. Higher-order modes have shorter wavelengths than lower-order modes. The RMS center wavelength for each radial offset is indicated by an arrow.
Figure 4:
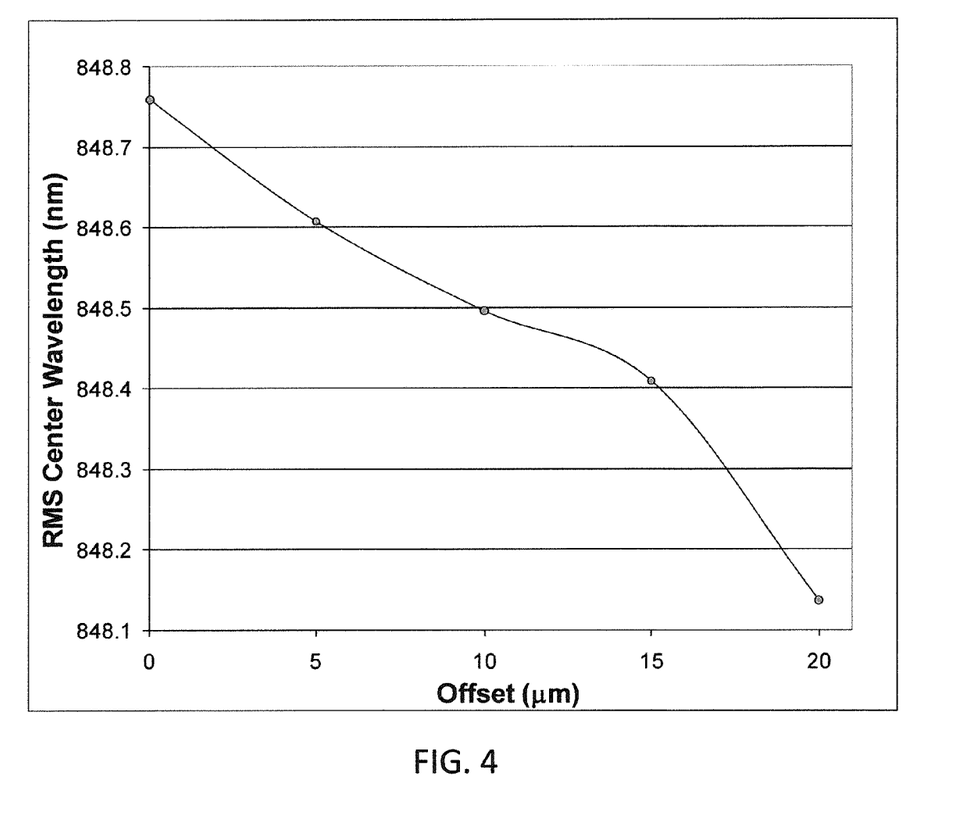
FIG. 4 depicts a graph of an RMS center wavelength measured across a MMF for a Bit Error Rate (BER) test system VCSEL, in accordance with one embodiment of the present invention.

We see in FIG. 3 that as the lateral offset increases, the relative optical power carried by the longer wavelengths (near 849.33 nm) diminishes, while the relative power of the shorter wavelengths (near 848.1 nm) increases. It is also observed that there is an overall shift to shorter wavelengths at large radial offsets. As a result of this radial distribution of the spectrum, the optical pulse at zero offset has a longer RMS center wavelength than at larger radial offsets, as indicated in FIG. 4 by the arrows. The center wavelength, $\lambda_c$, is the RMS weighted average of the optical peaks given by, $$\lambda_c = \frac{\sum_{i=1}^{N} P_i \lambda_i}{\sum_{i=1}^{N} P_i} \quad (1)$$

Although the spectral distribution of VCSEL modes may vary from device to device, the physics of the device remain unchanged and a nominal radial distribution can be approximated. Using a representative VCSEL radial distribution in combination with the spatial coupling into guided fiber modes, it is possible to improve the refractive index profile of a MMF to reduce modal dispersion, improving MMF performance. Thus, it would be desirable to have a new refractive index profile that compensates for radially dependent wavelength emission patterns of laser sources in order to reduce modal dispersion in a MMF or other waveguides.

SUMMARY

In one aspect, a multimode fiber optic cable is provided. The multimode fiber optic cable includes, but is not limited to, a refractive index profile which is designed to compensate for a radially dependent wavelength distribution of laser launch modes coupled into the multimode fiber optic cable in order to minimize modal dispersion within the multimode fiber optic cable.

In one aspect, a method for designing an improved multimode fiber optic cable which compensates for a radially dependent wavelength distribution of laser launch modes coupled into a reference multimode fiber optic cable is provided. The method includes, but is not limited to, determining an amount of material and modal dispersion within the reference multimode fiber optic cable resulting from a pulse of light radiation launched into the reference multimode fiber optic cable using a laser by measuring a DMD waveform profile into the reference multimode fiber optic cable. The reference multimode fiber optic cable has a reference refractive index profile. The method also includes, but is not limited to, designing an improved refractive index profile for the improved multimode fiber optic cable which compensates for at least a portion of the radially dependent wavelength distribution of laser launch modes coupled into the reference multimode fiber optic cable.

In one aspect, a method for designing an improved multimode fiber optic cable which compensates for material dispersion and modal dispersion is provided. The method includes, but is not limited to, measuring a DMD waveform profile into the reference multimode fiber optic cable. The reference multimode fiber optic cable has a reference refractive index profile. The method also includes, but is not limited to, designing an improved refractive index profile for the improved multimode fiber optic cable which compensates for at least a portion of any material dispersion in the reference multimode fiber optic cable.

The scope of the present invention is defined solely by the appended claims and is not affected by the statements within this summary.

BRIEF DESCRIPTION OF THE DRAWINGS

The invention can be better understood with reference to the following drawings and description. The components in the figures are not necessarily to scale, emphasis instead being placed upon illustrating the principles of the invention.

DETAILED DESCRIPTION

The present invention makes use of the discovery that providing a multimode fiber having an improved refractive index profile designed to compensate for the radially dependent wavelength emission pattern of laser launch modes helps to reduce modal dispersion when coupled into multimode fiber modes. The resultant improved refractive index profile will reduce modal dispersion improving optical waveguide performance.

Modal dispersion in a MMF is characterized by Differential Mode Delay (DMD) profiles measured in accordance with Telecommunications Industry Association Document No. TIA-455-220-A. Since achieving a perfect refractive index profile is exceedingly difficult, biasing the DMD profile so that the radial waveform peak at about a 19 micron offset arrives at the output of the fiber sooner than the waveform peak at about 5 microns is sufficient to partly compensate for the RMS center wavelengths distribution of fiber modes. The current standard parabolic refractive index profile was defined as the optimum profile that minimized modal dispersion as measured by DMD using a monochromatic source, having a single measurement wavelength.

Figure 5A:
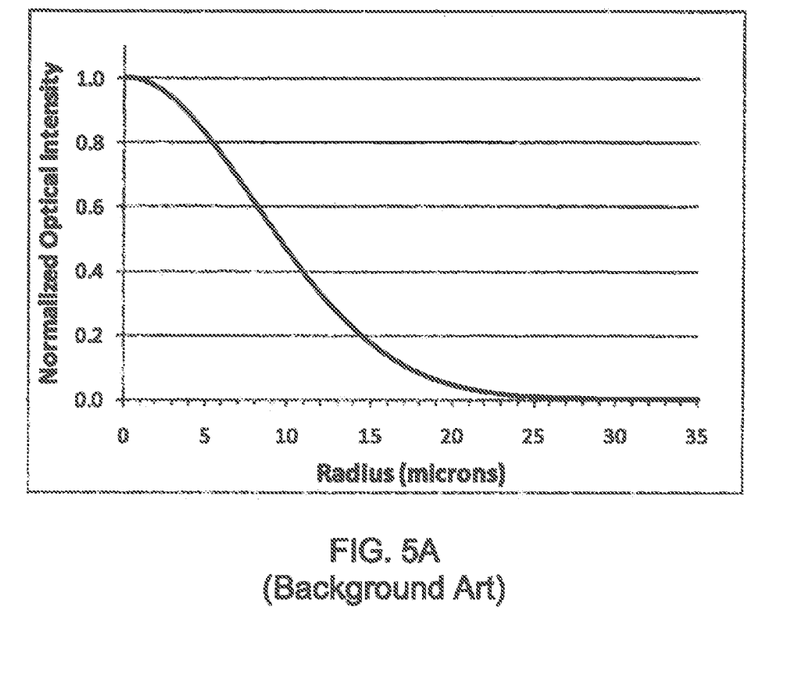
FIG. 5A depicts a graph of an approximated optical intensity (Gaussian) distribution of a VCSEL, in accordance with one embodiment of the present invention.

Assuming the optical intensity of a VCSEL, as well as other optical sources, can be approximated by a Gaussian distribution, as shown in FIG. 5A, one can conclude that most of the optical power (>80%) propagates within the 5 micron to 19 micron radial window, which closely matches the width of a distribution at half maximum.

It is therefore preferred that a change in radial refractive index profile occurs at least within a 5 micron to 19 micron radial window. Clearly, other representative points might be more suitable for different VCSEL designs. In this disclosure, a preferred deviation in refractive index profile is first specified that helps to minimize the effect of wavelength dependent modes across the entire fiber core for a representative VCSEL spectrum. Since the optimal refractive index profile depends on the spectral width of the optical light source, the proposed techniques can be applied to any spectral width and spatial distribution.

In a first example, a nominal spectral width of 1 nm is used, which contains >95% of the optical power, which differs from the calculated spectral width defined in TIA/EIA-455-224, "Calibration of Fibre Optic Chromatic Dispersion Test Sets," May 2002, which specifies the Δ RMS spectral width is given by:

$$\Delta\lambda_{rms} = \left[\left(\frac{\sum_{i=1}^{N} P_i \lambda_i^2}{\sum_{i=1}^{N} P_i}\right) - \lambda_c^2\right]^{1/2} \quad (2)$$

The Δ RMS spectral width underestimates the effect of the wide spectral distribution of VCSELs.

Figure 6:
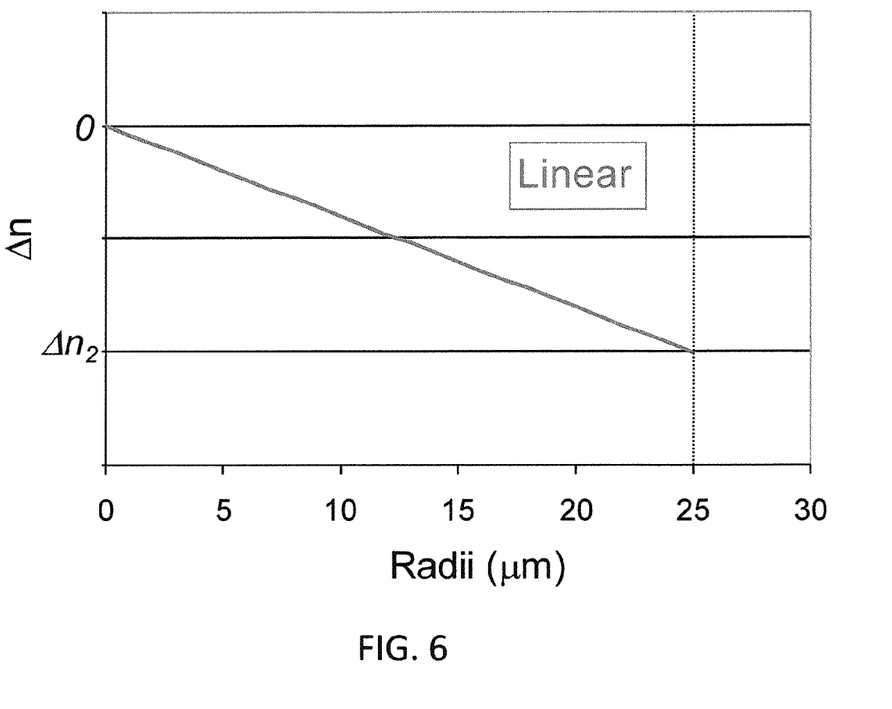
FIG. 6 depicts a graph of reduction in refractive index, $\Delta n$, required to correct for the radial wavelength dependence of optical sources, in accordance with one embodiment of the present invention.

In one embodiment of the present invention, the change in refractive index, Δn, required to minimize modal dispersion for a given radial distribution of modal wavelengths will look in general like the curve shown in FIG. 6. In this embodiment, while a linear decrease in the refractive index profile is chosen, other functions may be identified that further enhance the wavelength compensation for different source emission patterns.

Figure 7:
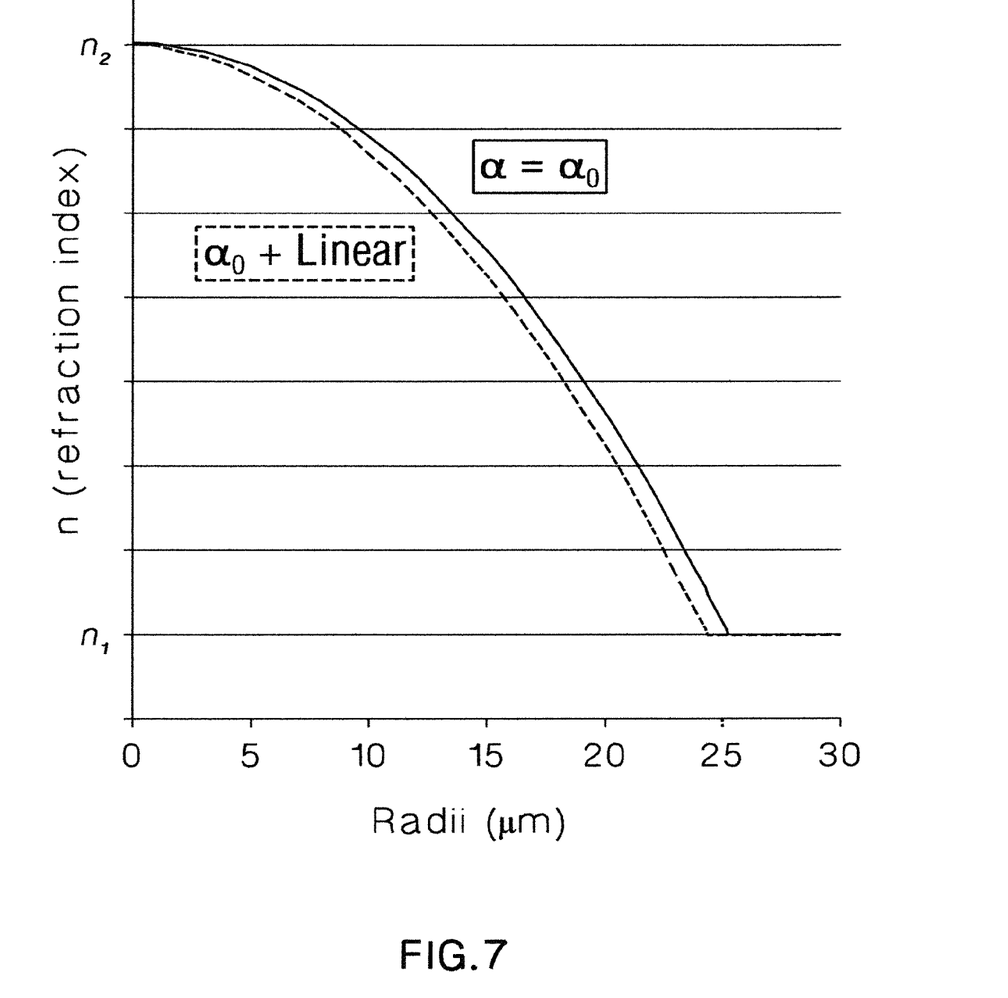
FIG. 7 depicts a graph of a standard parabolic refractive index profile that minimizes Differential Mode Delay (DMD) for a single wavelength, shown in Green (Green, $\alpha=\alpha_0$), in accordance with one embodiment of the present invention. A proposed improved refraction index profile that minimizes total dispersion, modal dispersion plus chromatic, or material, dispersion is shown in Red. Note this is an exaggerated representation since the changes are not visible in the graph for the proposed values. Note chromatic dispersion and material dispersion may be used interchangeably herein.

This reduction in the refractive index profile modifies the parabolic refractive index profile as shown in FIG. 7. The maximum change in Δn given by $\Delta n/(n_2-n_1)$ is very small, on the order of 0.2% of n for the VCSEL considered here. For the purpose of illustration, the changes are expanded by a factor of 30 in FIG. 7. Example indices of refraction are on the order of $n_2$(core center index)=1.46 and $n_1$(cladding index)=1.45.

With reference to FIG. 7, for an improved refractive index profile, shown in Red, the radial dimension of the core is less than 25 microns. However, the actual value of Δn, Δr, is so small that this difference is completely negligible (Δr/r=0.11%). The tolerance for MMF is 6% as specified in TIA-492AAAC and TIA-492AAAD.

Figure 8:
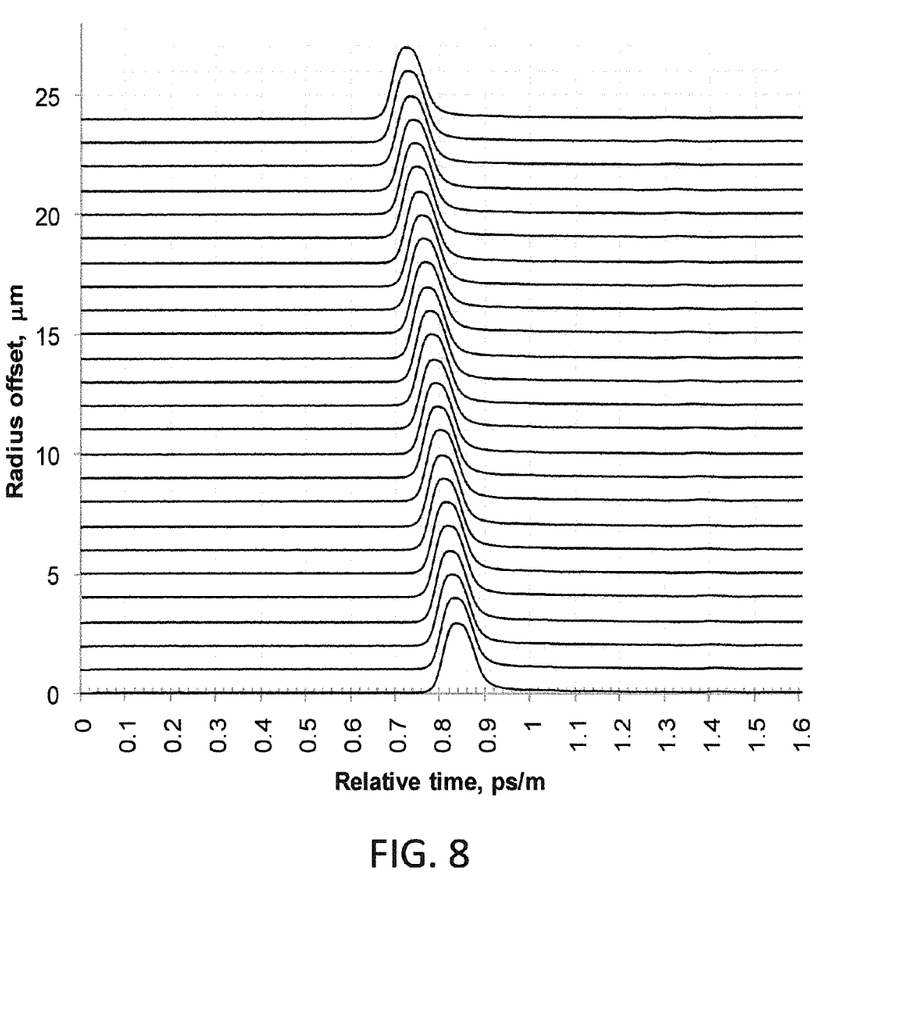
FIG. 8 depicts a graph of a proposed DMD pulse waveform distribution optimized for the spatial spectral distribution of a VCSEL coupled into a MMF, in accordance with one embodiment of the present invention. This DMD pulse waveform distribution will compensate for chromatic, or material, dispersion and decrease total dispersion.

The proposed improved refractive index profile will produce an improved DMD waveform profile (using a narrow wavelength laser source) as shown in FIG. 8. The improved DMD waveform profile is characterized by a monotonic shift to the left in radial pulse waveforms for increasing radii. Since communication networks using MMFs employ VCSELs, the radially dependent wavelength emission pattern shown in FIG. 8 will partly compensate for modal dispersion such that all modes arrive at the detector at substantially the same time. As a result, lower total dispersion is achieved and a higher-performance multimode fiber is realized. There are several ways in which a refractive index profile can be adjusted to achieve the same or similar DMD waveform profile with reduced modal dispersion, as shown in FIG. 8.

Figure 9:
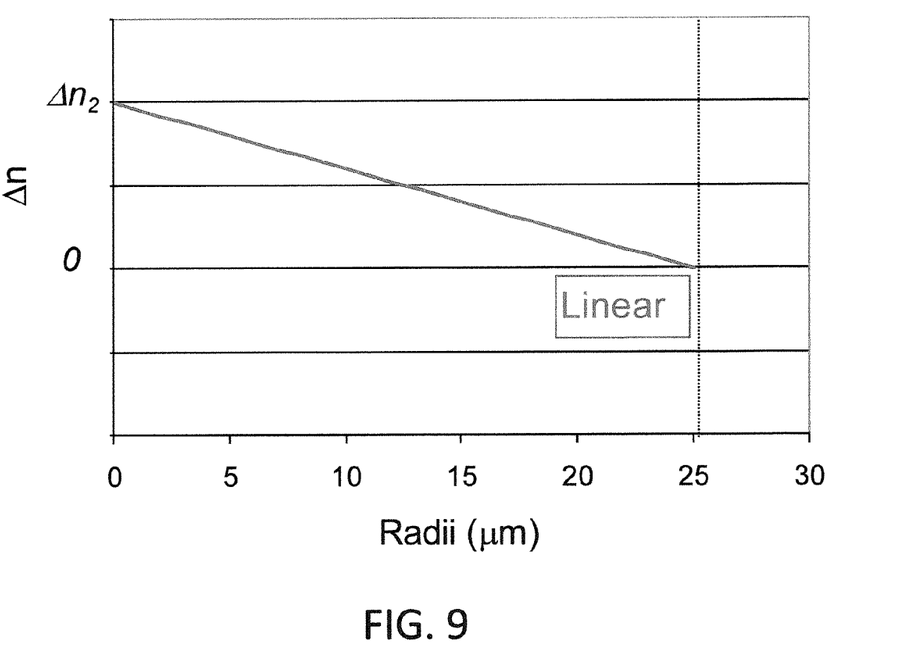
FIG. 9 depicts a graph of a linear increase in refractive index, $\Delta n$, for decreasing radii required to correct for the spectral width and radial dependence of optical modal wavelengths, in accordance with one embodiment of the present invention.
Figure 10:
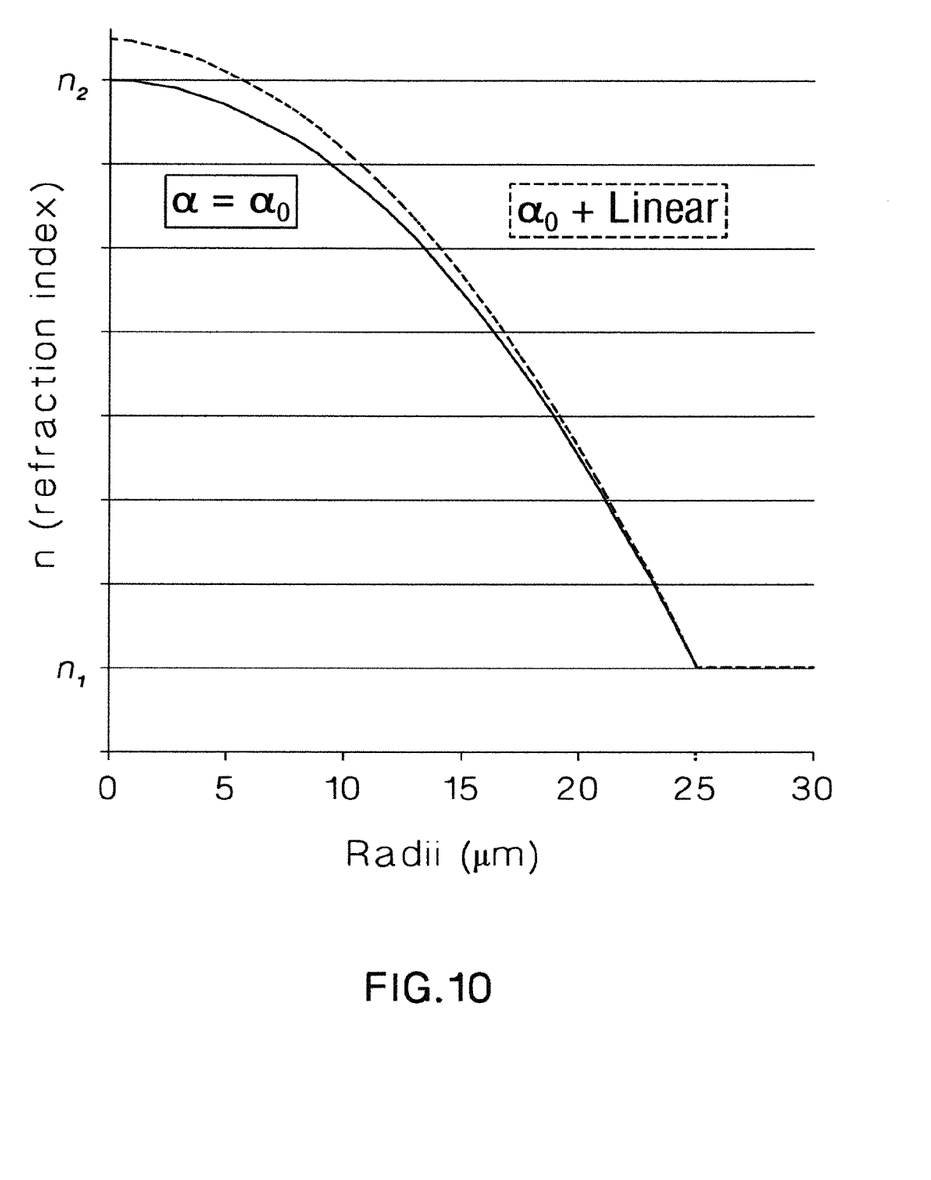
FIG. 10 depicts a graph of a standard parabolic refraction index profile that minimizes DMD for a single wavelength, shown in Green (Green, $\alpha=\alpha_0$), in accordance with one embodiment of the present invention. In a proposed improved refraction index profile that minimizes total dispersion, shown in red, the change in refractive index, $\Delta n$, is increased for decreasing radii required to correct for the radial dependence of optical wavelengths.
Figure 11:
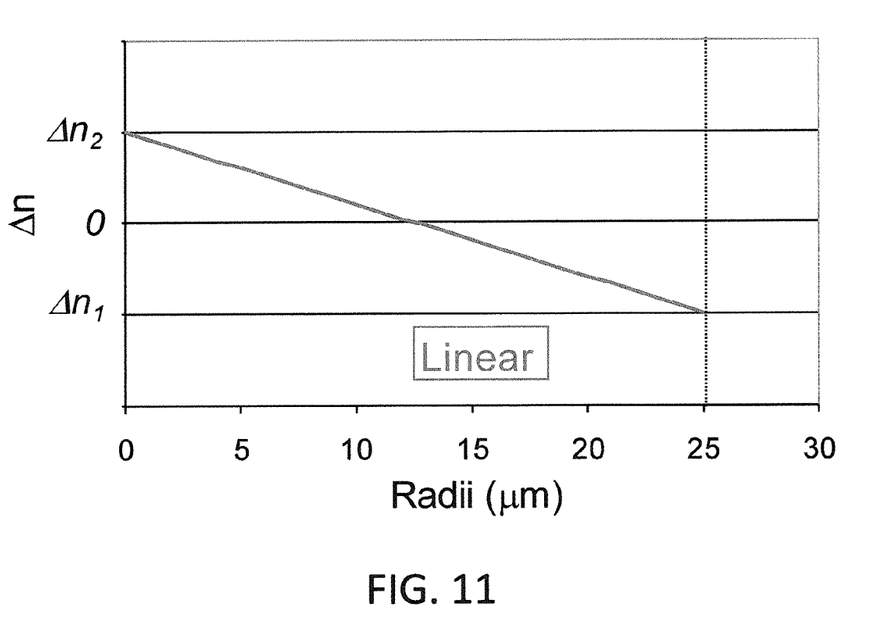
FIG. 11 depicts a graph of a linear change in refractive index, $\Delta n$, relative to a predetermined radial position, in accordance with one embodiment of the present invention. $\Delta n$ increases as the radius decreases below $r_0$ and decreases for increasing radii above $r_0$. The total change $\Delta n$ must be selected to correct for the spectral width and radial dependence of the emission wavelength VCSELs.

For example, the refractive index can increase at smaller radii, as shown in FIG. 9. The resulting modification to a standard, or reference, parabolic refractive index profile for this alternative compensation method is illustrated in FIG. 10.

Figure 5B:
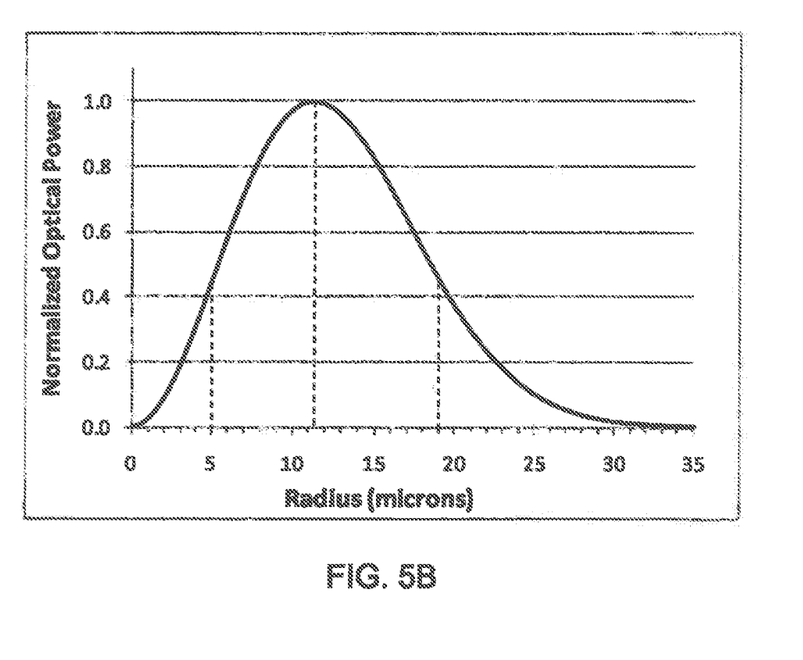
FIG. 5B depicts a graph of normalized optical power (Power=Intensity×Area) of a VCSEL, in accordance with one embodiment of the present invention.
Figure 12:
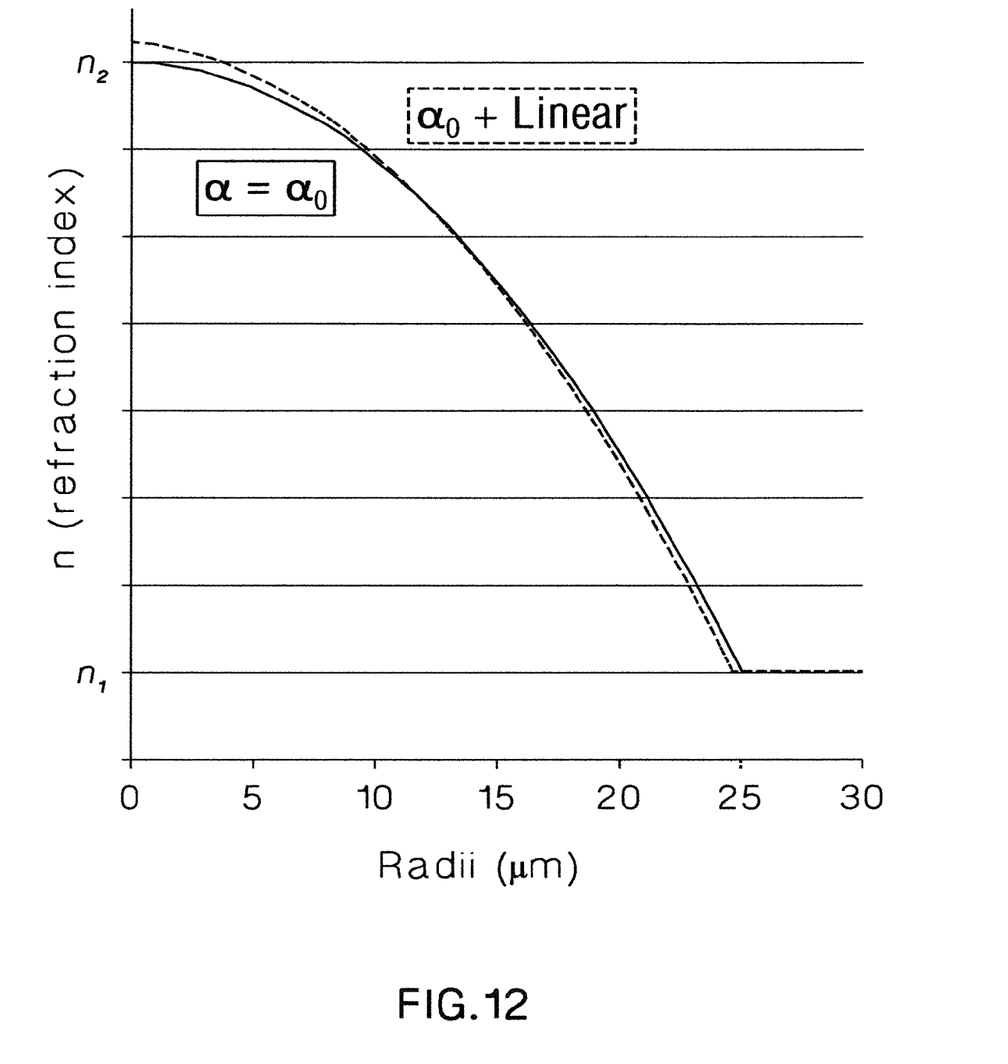
FIG. 12 depicts a graph of a standard parabolic refraction index profile that minimizes DMD for a single wavelength, shown in Green (Green, $\alpha=\alpha_0$), in accordance with one embodiment of the present invention. Shown in Red is a proposed improved refraction index profile for a linear variation of $\Delta n$, such that the optimized refractive index is higher for radii above $r_0$ and lower below $r_0$.

Alternatively, the change in the refractive index, Δn, can be adjusted relative to a predetermined radial position. For example, we can use a radial position that corresponds to the maximum peak optical power, as shown in FIG. 5B. In this case, Δn increases as the radius decreases below $r_0$, and decreases for radii above $r_0$, where $r_0$ is the radial position for which Δn is zero. The total change Δn will still correct for the spectral width and radial distribution of the light emitted by the VCSEL. The corresponding change in refractive index profile for this case is illustrated in FIG. 12.

Figure 13:
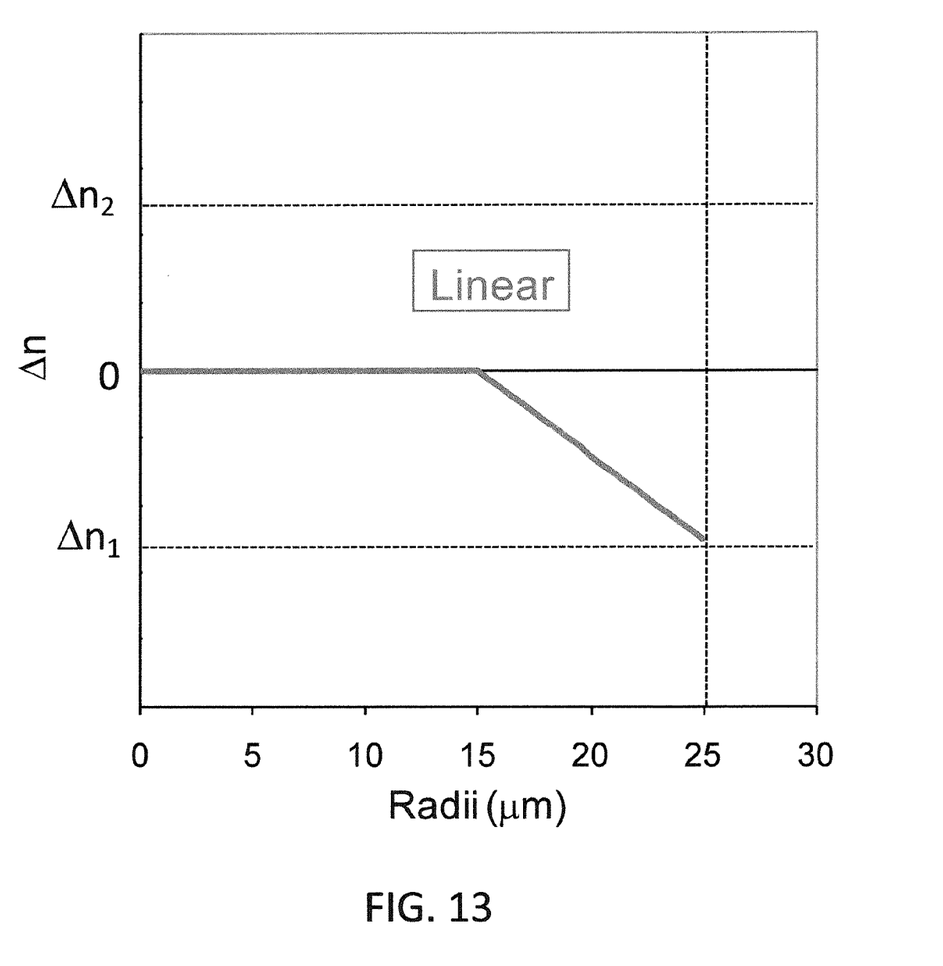
FIG. 13 depicts a graph of an alternative change in refractive index profile in a region of high optical power, in accordance with one embodiment of the present invention.
Figure 14:
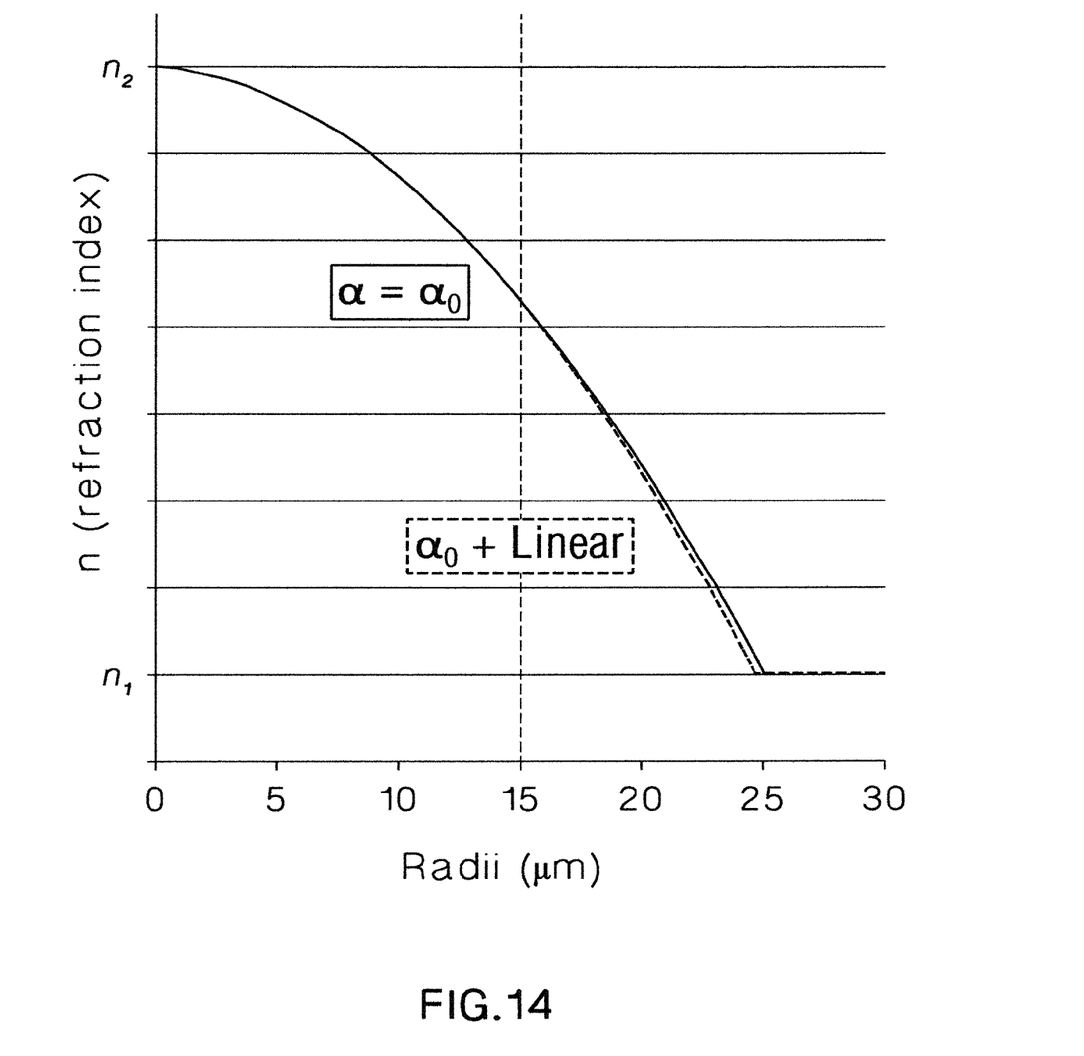
FIG. 14 depicts a graph of a standard parabolic refraction index profile that minimizes DMD for a single wavelength, shown in Green (Green, $\alpha=\alpha_0$), in accordance with one embodiment of the present invention. Shown in Red is a proposed improved refraction index profile for a step linear variation of $\Delta n$, such that the optimized refractive index is smaller for radii above $r_0$.

Because little optical power (<20%) resides in the inner and outer regions of the MMF, (i.e., at radii less than 5 microns and greater than 19 microns), a partial modification to the refractive index profile is sufficient to reduce modal dispersion. Implementing a linear reduction in the refractive index profile at a radial distance beyond 5 microns has been found to significantly reduce modal dispersion. With reference to FIG. 13, a Δn is illustrated for a sample MMF that exhibits high performance, where the corresponding refractive index profile is illustrated in FIG. 14.

Figure 15:
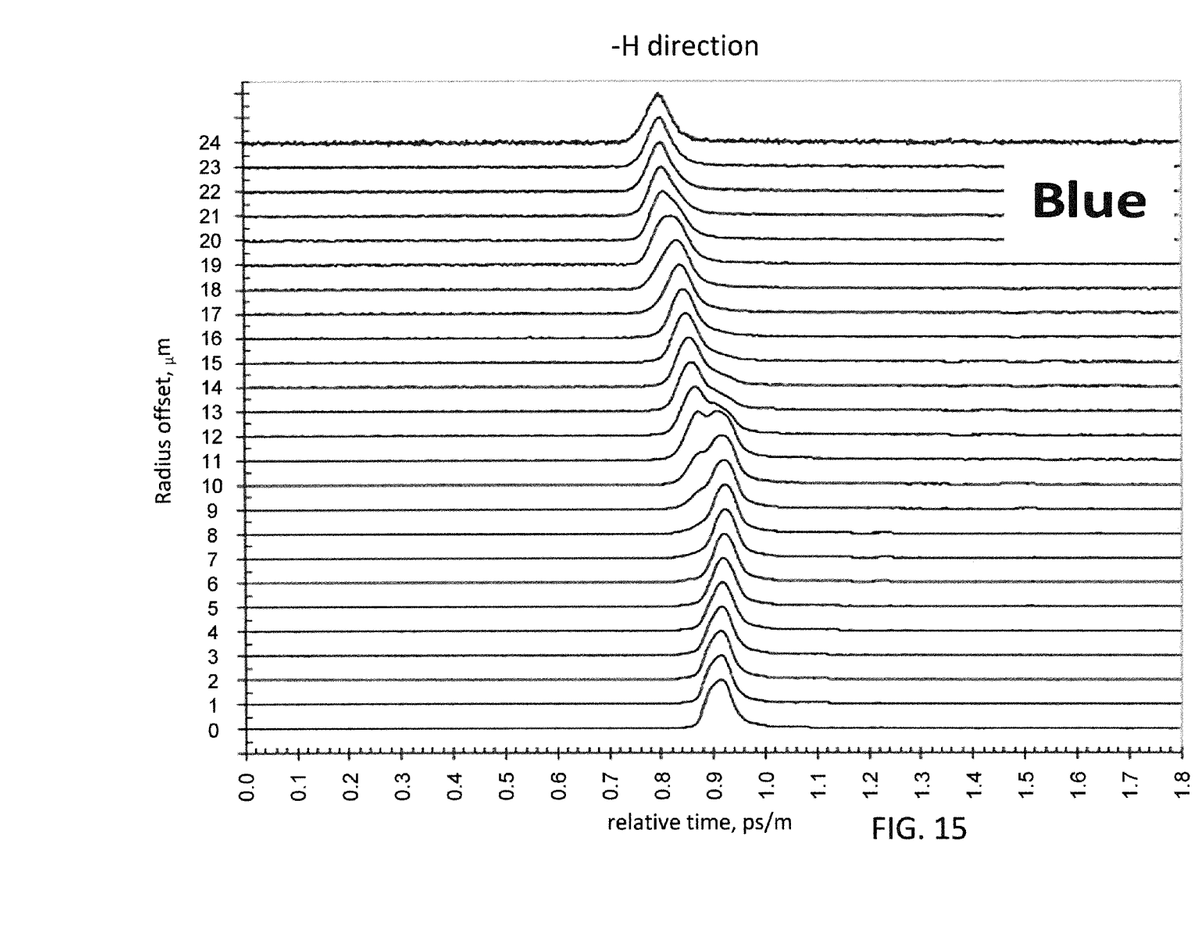
FIG. 15 depicts a graph of a measured DMD pulse waveform distribution for an OM3 MMF exhibiting higher than expected system performance, in accordance with one embodiment of the present invention.

The measured DMD waveform profile for this high-performance MMF is shown in FIG. 15. Although this proposed shift does not cover the total area of high optical power, this partial shift is sufficient to reduce modal dispersion resulting in a high-performance MMF.

In general, by biasing the refractive index profile such that a DMD waveform which peaks at about a 19 micron radial offset arrives at the output of the fiber sooner than a DMD waveform which peaks at about a 5 micron radial offset, a reduction in modal dispersion will be realized. According to one embodiment, the profile can be biased such that the peak at the 19 micron radial offset can be ±8 microns and the peak at the 5 micron radial offset can be ±5 microns. This bias metric is defined as the difference in relative delay between the DMD waveform peak at about a 19 micron offset (normalized to the fiber length in units of picoseconds per meter) and the DMD waveform peak at about a 5 micron offset (ps/m). DMD waveform profiles compliant with this metric are said to be "left" shifted. A relative delay bias metric on the order of 0.01 to 0.1 ps/m is sufficient to show improved Bit Error Rate (BER) system performance for typically radial wavelength distributions characteristic of VCSELs used in high-speed Ethernet. It is important to note that fibers having DMD waveform profiles that exhibit a "right" shift, where modes at 19 micron offsets arrive later at the output of the fiber than those at 5 microns, result in high modal dispersion and hence, poor BER system performance. Also, a MMF having a left-shifted DMD waveform profile performs better than one with no shift, traditionally believed to be the highest-performance DMD waveform profile with the lowest modal dispersion.

Since MMFs typically exhibit one or more core defects, using a left-shifted DMD waveform profile is a simple and effective method of specifying modal dispersion compensation for improved fiber performance.

In one embodiment of the present invention, fibers displaying desirable core defects are selected for use. In this disclosure, while a linear change in refractive index $\Delta n$ is used, alternative functions can also be used.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims. Accordingly, the invention is not to be restricted except in light of the appended claims and their equivalents.

The invention claimed is:

1. A multimode fiber optic cable comprising:
   a core having a center and a maximum radius,
   said core further having a modified refractive index profile designed to compensate for a radially dependent wavelength distribution of laser launch modes coupled into the multimode fiber optic cable in order to minimize modal dispersion within the multimode fiber optic cable,
   said modified refractive index profile characterized by a differential mode delay (DMD) waveform profile having a shift to the left in radial pulse waveforms for increasing radii within a window from 5 microns to 19 microns from said center of said core, said shift to the left occurring in more than 50 percent of said window, wherein a waveform peak at 19 microns is offset from a waveform peak at 5 microns by 0.01 ps/m to 0.1 ps/m,
   and said modified refractive index profile further characterized by a modified quantity $\Delta n(r)$ such that wavelength variations in launch modes compensate for at least some modal dispersion.

2. The multimode fiber optic cable of claim 1, wherein said shift to the left in radial pulse waveforms is a monotonic shift to the left for increasing radii.

* * * * *